United States Patent
Choi et al.

(10) Patent No.: US 8,203,469 B2
(45) Date of Patent: Jun. 19, 2012

(54) SIGNAL ENCODING APPARATUS AND METHOD OF RADIO FREQUENCY IDENTIFICATION READER

(75) Inventors: Jae-won Choi, Changwon (KR); Soo-kyum Kim, Suwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 49 days.

(21) Appl. No.: 12/939,414

(22) Filed: Nov. 4, 2010

(65) Prior Publication Data

US 2011/0102209 A1    May 5, 2011

(30) Foreign Application Priority Data

Nov. 4, 2009  (KR) .................. 10-2009-0106036

(51) Int. Cl.
*H03M 7/12* (2006.01)
(52) U.S. Cl. ............................................ 341/70; 341/50
(58) Field of Classification Search .................. 341/50, 341/70, 71; 714/55, 52
See application file for complete search history.

(56) References Cited

U.S. PATENT DOCUMENTS

| | | | |
|---|---|---|---|
| 6,985,510 B2 * | 1/2006 | Willenegger | 375/141 |
| 7,032,164 B2 * | 4/2006 | Cameron et al. | 714/792 |
| 2008/0172590 A1 * | 7/2008 | Shen et al. | 714/755 |
| 2008/0297309 A1 | 12/2008 | Loyer | |

FOREIGN PATENT DOCUMENTS

| | | |
|---|---|---|
| JP | 2001-283162 A | 10/2001 |
| JP | 2008-021157 A | 1/2008 |
| JP | 2008-206165 A | 9/2008 |

* cited by examiner

*Primary Examiner* — Peguy Jean Pierre
(74) *Attorney, Agent, or Firm* — Sughrue Mion, PLLC

(57) ABSTRACT

A signal encoding apparatus and method of a radio frequency identification (RFID) reader capable of removing a high frequency component without using a digital filter, and performing Manchester encoding by using two symbols. The signal encoding apparatus of the RFID reader including an encoding unit that stores a first symbol and a second symbol; transmits the first symbol if data received after an initial state is zero (0), and returns to the initial state; delays for a given time period if the data received after the initial state is one (1); transmits the second symbol if data received after the delayed given time period is zero (0), and returns to the initial state; and transmits the first symbol if the data received after the delayed given time period is one (1), and stands by.

18 Claims, 6 Drawing Sheets

"FIRST SYMBOL"     "SECOND SYMBOL"

SIGNAL ENCODING APPARATUS AND METHOD OF RADIO FREQUENCY IDENTIFICATION READER

CROSS-REFERENCE TO RELATED PATENT APPLICATION

This application claims priority from Korean Patent Application No. 10-2009-0106036, filed on Nov. 4, 2009, in the Korean Intellectual Property Office, the disclosure of which is incorporated herein in its entirety by reference.

BACKGROUND

1. Field

Apparatuses and methods consistent with exemplary embodiments relate to a signal encoding apparatus and method of a radio frequency identification (RFID) reader capable of removing a high frequency component and performing Manchester encoding by using two symbols.

2. Description of the Related Art

Recently, a radio frequency identification (RFID) technology for automatically recognizing an object has been in the limelight. The RFID technology is used in a system capable of wirelessly transmitting and receiving various types of data via a predetermined frequency band.

In the case of a magnetic code and a bar code, they require an externally exposed specific mark of which the recognition rate gradually deteriorates according to time due to damage or abrasion. On the other hand, a system formed of an RFID tag and an RFID reader may solve the above problem.

The RFID system has become a new solution for various types of automation businesses, object managements, distribution businesses, or the like. For example, the RFID system is used in credit or debit cards, prepaid or deferred payment bus cards, metro cards, parking cards, mail-delivery systems, history statements of animals, or the like.

SUMMARY

One or more exemplary embodiments provide a signal encoding apparatus and method of a radio frequency identification (RFID) reader capable of removing a high frequency component without using a digital filter, and performing Manchester encoding by using two symbols.

According to an aspect of an exemplary embodiment, there is provided a signal encoding apparatus of an RFID reader, the signal encoding apparatus including an encoding unit which may store a first symbol and a second symbol; transmit the first symbol if data received after an initial state is zero (0), and return to the initial state; delay for a given time period if the data received after the initial state is one (1); transmit the second symbol if data received after the delayed given time period is zero (0), and return to the initial state; and transmit the first symbol if the data received after the delayed given time period is one (1), and stand-by.

The first symbol may have the same period as a Manchester encoding data rate.

The second symbol may have a period that is 1.5 times of the Manchester encoding data rate.

The delay may have a period that is 0.5 times of the Manchester encoding data rate According to an aspect of another exemplary embodiment, there is provided a signal encoding method performed by an RFID reader. The signal encoding method may include: transmitting a first symbol if data received after an initial state is zero (0), and then returning to the initial state, and delaying for a given time period if the data received after the initial state is one (1); and transmitting the second symbol if data received after the delayed given time period is zero (0), and then returning to the initial state, and transmitting the first symbol if the data received after the delayed given time period is one (1), and then standing by.

The first symbol may have the same period as a Manchester encoding data rate.

The second symbol may have a period that is 1.5 times of the Manchester encoding data rate.

The delay may have a period that is 0.5 times of the Manchester encoding data rate

BRIEF DESCRIPTION OF THE DRAWINGS

The above and other aspects will become more apparent by describing in detail exemplary embodiments with reference to the attached drawings, in which.

DETAILED DESCRIPTION OF EXEMPLARY EMBODIMENTS

Hereinafter, exemplary embodiments will be described in detail with reference to the attached drawings. The inventive concept should not be construed as being limited to the exemplary embodiments set forth herein; rather, these exemplary embodiments are provided so that this disclosure will be thorough and complete.

Figure 1A:
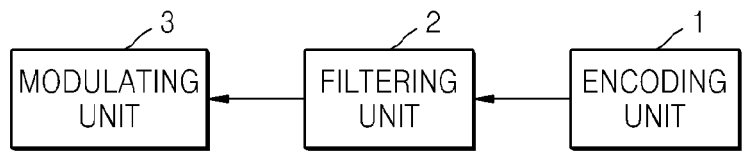
FIG. 1A illustrates a block diagram of a general configuration of a baseband transmission terminal of a radio frequency identification (RFID) reader.

FIG. 1A illustrates a block diagram of a general configuration of a baseband transmission terminal of a radio frequency identification (RFID) reader.

As illustrated in FIG. 1A, the baseband transmitting terminal of the RFID reader includes an encoding unit 1, a filtering unit 2, and a modulating unit 3. The encoding unit 1 encodes digital data to be transmitted to a tag (not shown), the filtering unit 2 removes a high frequency component of the encoded digital data, and the modulating unit 3 modulates the encoded digital data of which a high frequency component is removed.

Figure 1B:
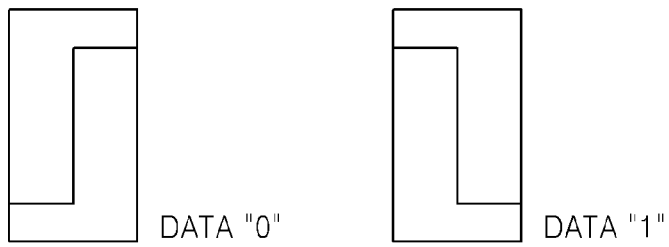
FIG. 1B illustrates two symbols used in encoding digital data in the baseband transmission terminal of FIG. 1A.
Figure 1C:
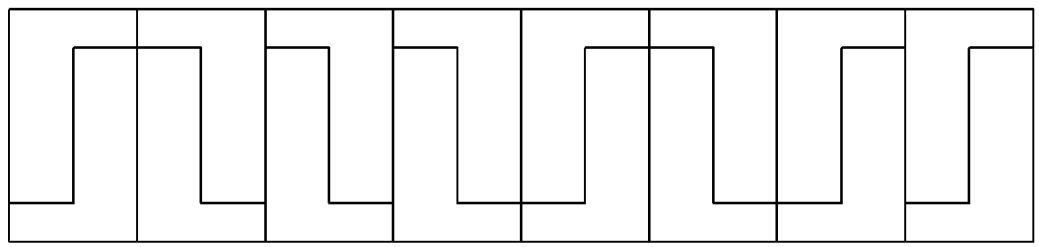
FIG. 1C illustrates an output from an encoding unit 1 of the baseband transmission terminal of FIG. 1A.
Figure 1D:
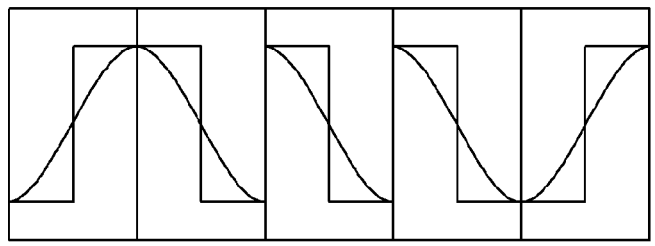
FIG. 1D illustrates an example of digital data of which high frequency components are removed by being processed by a filtering unit 2 of the baseband transmission terminal of FIG. 1A.

The encoding unit 1 may encode the digital data using a Manchester encoding method, in which the digital data may be encoded by using two symbols (data "0" and data "1") as illustrated in FIG. 1B. In a case where digital data "01110100" that is encoded by using the symbols as illustrated in FIG. 1B is transmitted to the tag, an output from the encoding unit 1 is shown in FIG. 1C. However, when the RFID reader transmits the digital data without a change, there remains a high frequency component in an angular component of each symbol. Therefore, the digital data may be processed by the filtering unit 2 to remove the high frequency component, and then, transmitted. FIG. 1D illustrates an example of digital data of which high frequency components are removed by being processed by the filtering unit 2.

In a case where the filter 2 is included in the baseband transmitting terminal, the number of gates increases accordingly, thereby increasing the size of the baseband transmitting terminal. However, it is necessary to include the filtering unit 2 so as to remove the high frequency components.

Figure 2:
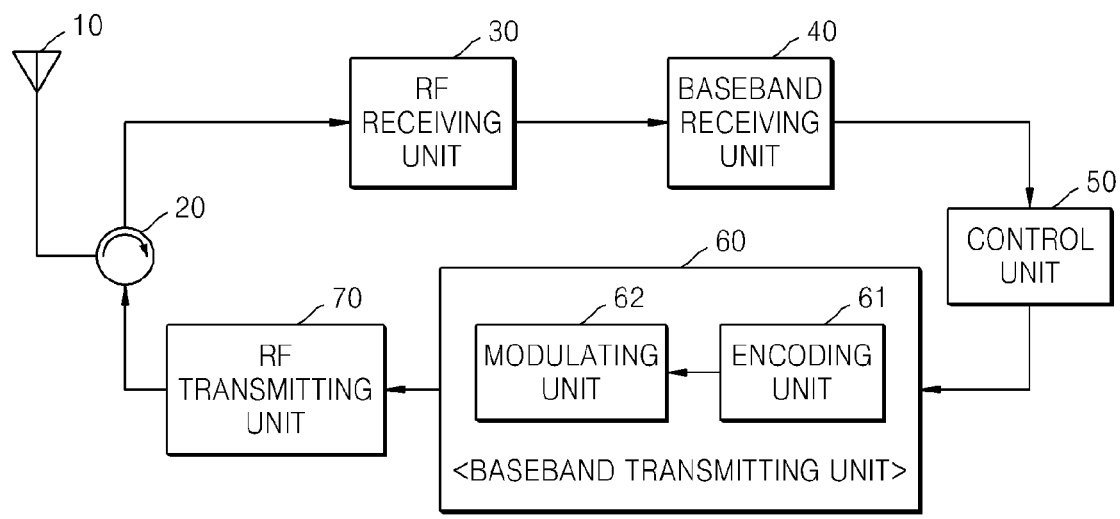
FIG. 2 illustrates a diagram of a structure of a signal encoding apparatus of an RFID reader, according to an exemplary embodiment.

FIG. 2 is a diagram illustrating a structure of an RFID reader having a signal encoding apparatus, according to an exemplary embodiment.

As illustrated in FIG. 2, the RFID reader having the signal encoding apparatus includes an antenna 10, a reception/transmission signal separating unit 20, an RF receiving unit 30, a baseband receiving unit 40, a control unit 50, a baseband transmitting unit 60 including an encoding unit 61, and a modulating unit 62, and an RF transmitting unit 70.

The antenna 10 has a structure in which a transmission signal and a reception signal are transmitted and received, respectively, and the reception/transmission signal separating unit 20 functions to separate the transmission signal and the reception signal, and then transmit the transmission signal to the antenna 10 and transmit the reception signal to the RF receiving unit 30.

The RF receiving unit 30 generates a baseband reception signal by performing filtering and amplifying operations on the reception signal received via the antenna 10.

The baseband receiving unit 40 performs filtering and amplifying operations on the baseband reception signal, converts the baseband reception signal into a digital signal, and then transmits the digital signal to the control unit 50.

The control unit 50 controls wireless communication with an RFID tag (not shown), processes a signal transmitted from the baseband receiving unit 40 into a digital signal on an application layer, and transmits the processed digital signal to the baseband transmitting unit 60.

The baseband transmitting unit 60 receives the digital signal from the control unit 50, performs encoding and modulating operations on the digital signal, converts the encoded and modulated digital signal into an analog signal, and outputs the analog signal to the RF transmitting unit 70. A detailed description regarding the baseband transmitting unit 60 will be provided later.

The RF transmitting unit 70 performs encoding and modulating operations on the analog signal processed by the baseband transmitting unit 60, and outputs the signal to the antenna 10 via the reception/transmission signal separating unit 20.

In the present exemplary embodiment, the baseband transmitting unit 60 includes the encoding unit 61 and the modulating unit 62 so as to perform the encoding and modulating operations on the digital signal transmitted from the control unit 50.

The encoding unit 61 performs the encoding operation on the digital signal, which is transmitted from the control unit 50, by using a Manchester encoding method. For this encoding operation, the encoding unit 61 sets and stores therein first and second symbols, as illustrated in FIG. 3A, according to an exemplary embodiment.

Figure 3A:
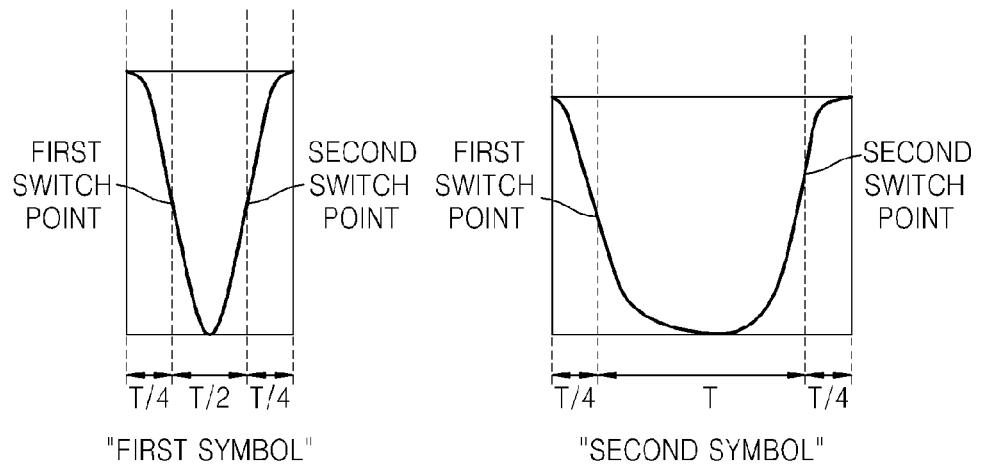
FIG. 3A illustrates two symbols used in encoding digital data by an encoding unit 61 in FIG. 2, according to an exemplary embodiment.

As illustrated in FIG. 3A, the first symbol has the same period as a Manchester encoding data rate T. The first symbol has a T/4 period from a symbol start point to a first switch point, a T/2 period from the first switch point to a second switch point, and a T/4 period from the second switch point to a symbol end point. The second symbol has a period that is 1.5 times of the Manchester encoding data rate T. The second symbol has a T/4 period from a symbol start point to a first switch point, a T period from the first switch point to a second switch point, and a T/4 period from the second switch point to a symbol end point.

Figure 3B:
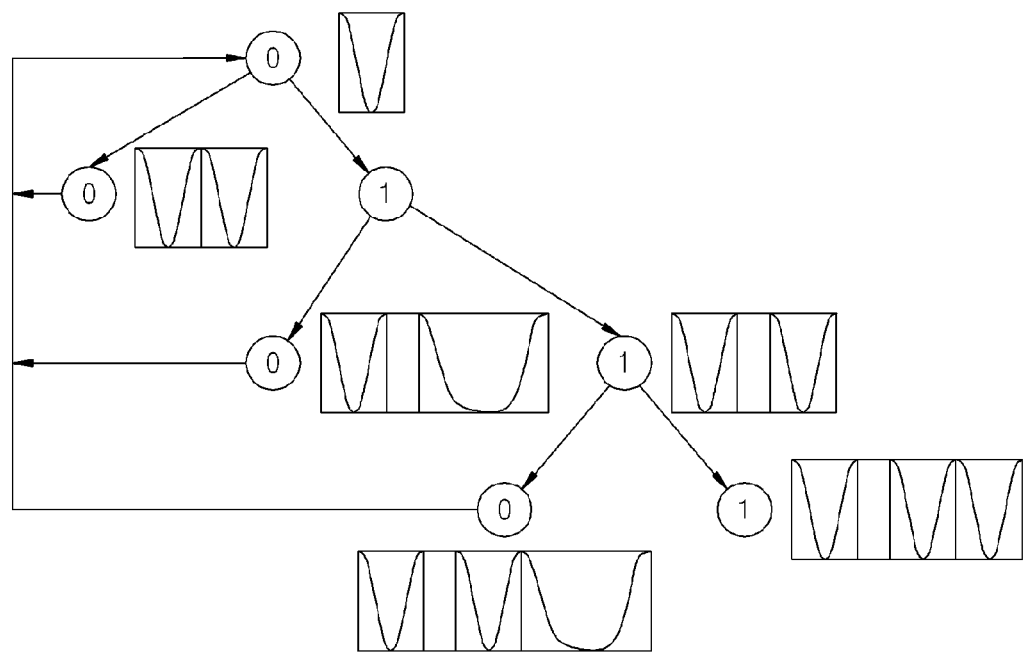
FIG. 3B illustrates an operation of the encoding unit 61 in FIG. 2, according to an exemplary embodiment.

Using the first and second symbols, the encoding unit 61 performs an encoding operation as illustrated in FIG. 3B, according to an exemplary embodiment. As described above, the encoding unit 61 sets and stores therein the first and second symbols, and sets an initial state as "0". If data received after the initial state is "0", the encoding unit 61 transmits the first symbol, and then returns to its initial state. If the data received after the initial state is "1", the encoding unit 61 delays for a predetermined time period, and if data received after a delay is "0", the encoding unit 61 transmits the second symbol, and then returns to its initial state, and if the data received after the delay is "1", the encoding unit 61 transmits the first symbol and stands-by. Next, if data received while the encoding unit stands by is "0", the encoding unit 61 transmits the second symbol and returns to its initial state, and, if the data received while the encoding unit stands by is "1", the encoding unit 61 transmits the first symbol and stands-by again.

The aforementioned encoding method will be described in detail with reference to a state machine of FIG. 4.

Figure 4:
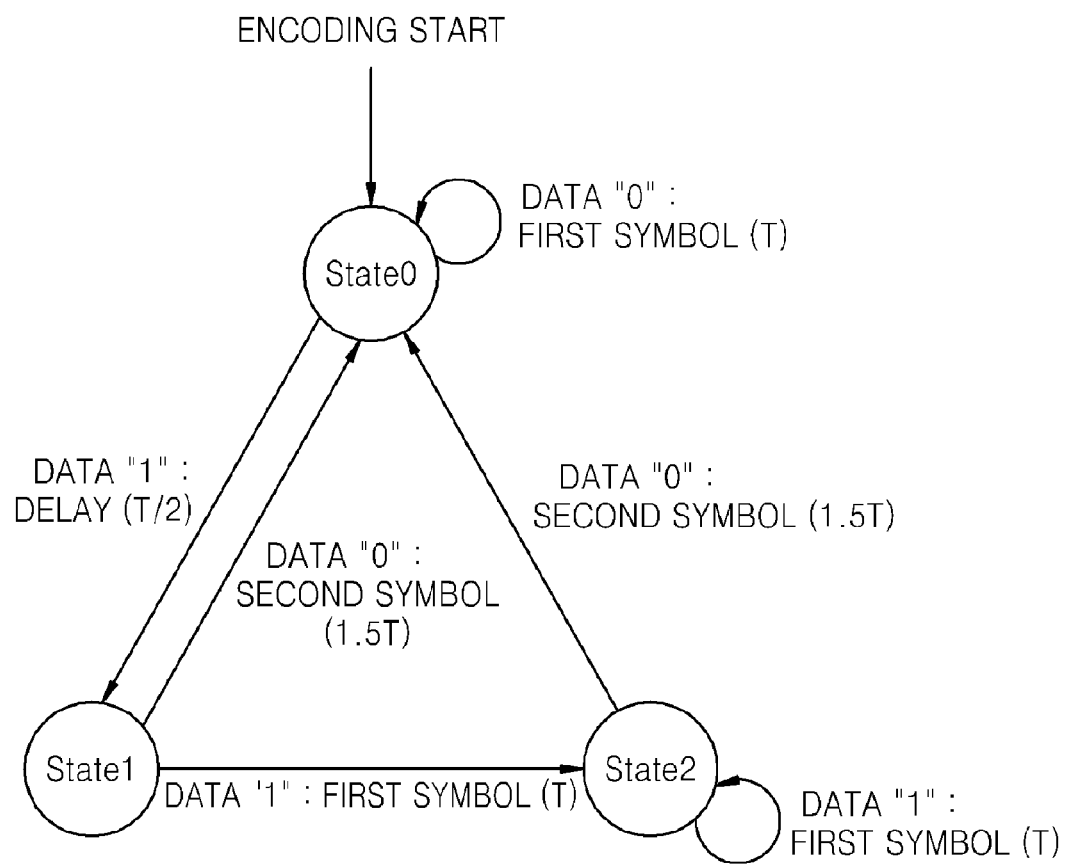
FIG. 4 illustrates a diagram of a state machine of the encoding unit 61 in FIG. 2, according to an exemplary embodiment.

Referring to FIG. 4, a state 0 indicates an initial state, and data "0" may be set as the initial state. A state 1 indicates a case in which input data is "1" in the initial state, and a state 2 indicates a case in which input data "1" is consecutively input in the initial state.

When an encoding operation is started so that data "0" is received at the state 0, the encoding unit 61 outputs the first symbol at the period T, and returns to the state 0. If data "1" is received at the state 0, the encoding unit 61 delays for a 0.5 T period, and is changed to the state 1.

If data "0" is received at the state 1, the encoding unit 61 outputs the second symbol at the 1.5 T period, and then returns to the state 0. If data "1" is received at the state 1, the encoding unit 61 outputs the first symbol at the T period, and is changed to the state 2.

If data "0" is received at the state 2, the encoding unit 61 outputs the second symbol at the 1.5 T period, and then returns to the state 0. If data "1" is received at the state 2, the encoding unit 61 outputs the first symbol at the T period and remains at the state 2.

Figure 5A:
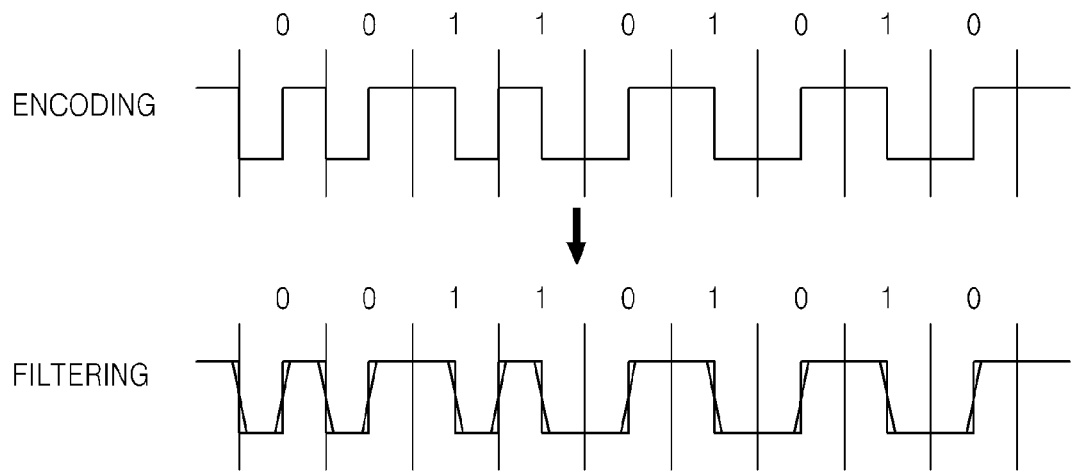
FIGS. 5A and 5B illustrate a comparison result between a result obtained by performing an encoding operation and then a filtering operation, and a result of an encoding operation, according to an exemplary embodiment.
Figure 5B:
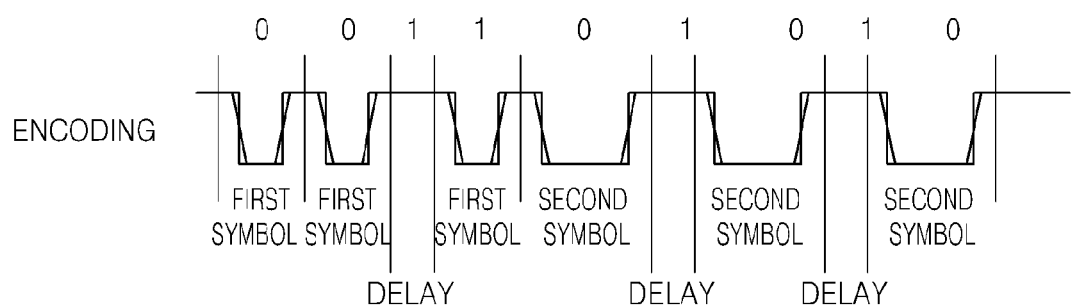

FIGS. 5A and 5B illustrate a comparison result between results obtained by performing an encoding operation and then a filtering operation, and a result of an encoding operation according to the present exemplary embodiment. The above results for the comparison are obtained by performing Manchester encoding on digital data "01101010" transmitted from the control unit 50 so as to be encoded, where data "0" is set as an initial state. The result that is obtained by performing the Manchester encoding and filtering on the digital data 01101010 is illustrated in FIG. 5A. The result that is obtained by performing encoding on the digital data "01101010" by using the first symbol, the second symbol, and the delay according to the present exemplary embodiment is illustrated in FIG. 5B. Referring to FIGS. 5A and 5B, it is evident that the encoding and filtering result is the same as the result of the encoding without separate filtering according to the present exemplary embodiment. In this manner, by using the encoding unit 61, it is possible to remove the high frequency components without using a digital filter.

Figure 6:
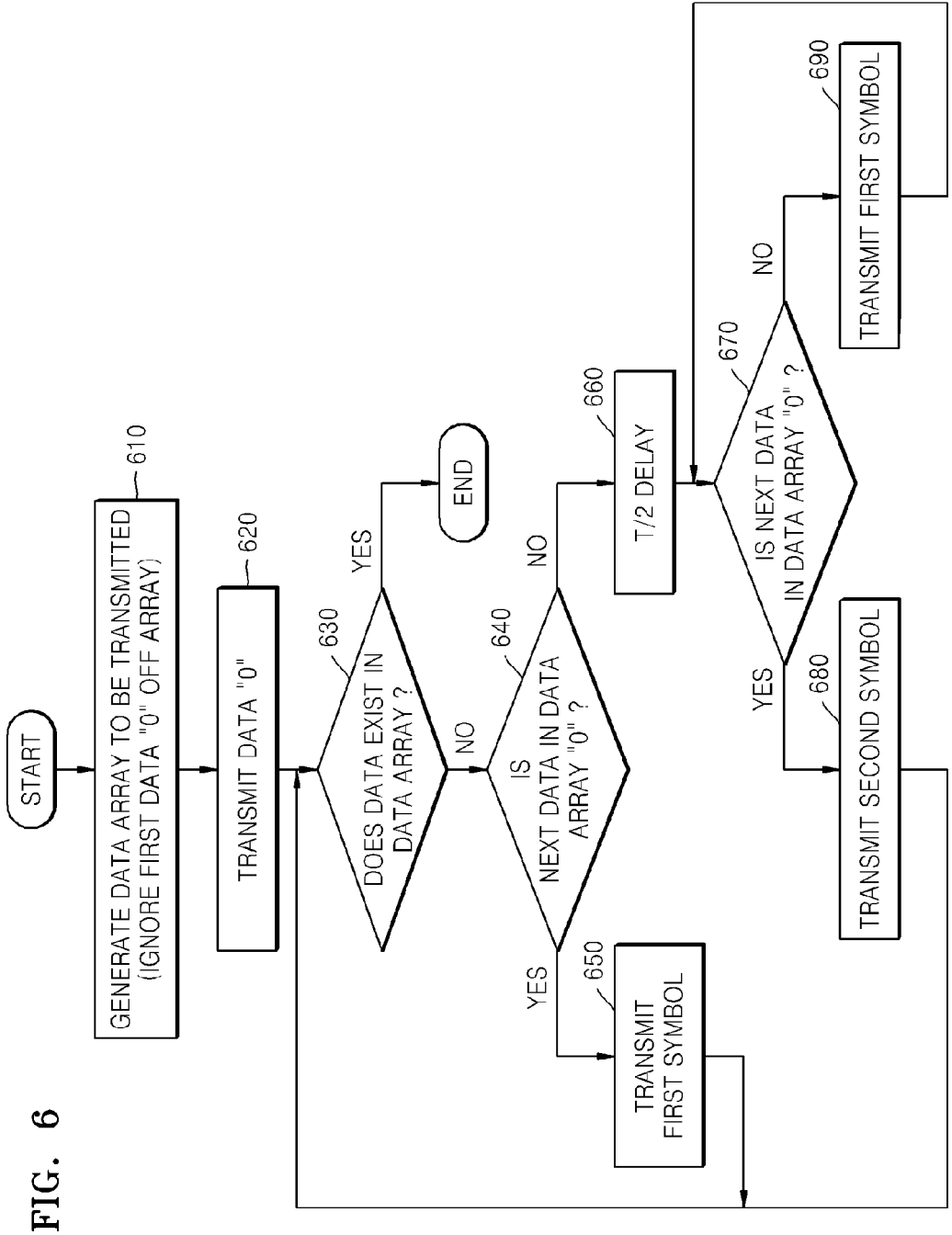
FIG. 6 illustrates a flowchart of a signal encoding method performed by an RFID reader, according to an exemplary embodiment.

FIG. 6 illustrates a flowchart of a signal encoding method performed by an RFID reader with reference to FIG. 2, according to an exemplary embodiment.

The encoding unit 61 receives a digital signal from the control unit 50, and generates a data array to be transmitted (operation 610). In order to perform an encoding operation by using a Manchester encoding method, the encoding unit 61 sets and stores therein the first symbol having the same period as the Manchester encoding data rate T, and the second symbol having a period that is 1.5 times of the Manchester encoding data rate T, as illustrated in FIG. 3A. First data of the data array is set as "0".

When the encoding operation is started, meaningless initial data "0" is transmitted (operation 620), and the encoding unit 61 determines the existence and non-existence of next data in the data array (operation 630). If the next data in the data array does not exist, the signal encoding method is ended.

Otherwise, if the next data in the data array exists, the encoding unit 61 determines whether the next data is "0" (operation 640).

If the next data is "0", the encoding unit 61 transmits the first symbol at the T period (operation 650).

However, otherwise, if the next data is "1", the encoding unit 61 delays for a 0.5 T period (operation 660).

After the delay of the 0.5 T period, the encoding unit 61 determines whether next data is "0" (operation 670).

When the next data is "0", the encoding unit 61 outputs the second symbol at a 1.5 T period, and returns to operation 630 (operation 680).

However, when the next data is "1", the encoding unit 61 outputs the first symbol at the T period, and returns to operation 670 (operation 690).

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A signal encoding apparatus, the signal encoding apparatus comprising an encoding unit which:
   stores a first symbol and a second symbol;
   transmits the first symbol if data received after an initial state is zero (0), and returns to the initial state;
   delays for a given time period if the data received after the initial state is one (1);
   transmits the second symbol if data received after the delayed given time period is zero (0), and returns to the initial state; and
   transmits the first symbol if the data received after the delayed given time period is one (1), and stands by.

2. The signal encoding apparatus of claim 1, wherein the encoding unit transmits the second symbol if data received while the encoding unit stands by after transmitting the first symbol is zero (0), and returns to the initial state.

3. A radio frequency identification (RFID) reader comprising the signal encoding apparatus of claim 2.

4. The signal encoding apparatus of claim 1, wherein the encoding unit transmits the first symbol if data received while the encoding unit stands by after transmitting the first symbol is one (1), and stands-by.

5. A radio frequency identification (RFID) reader comprising the signal encoding apparatus of claim 4.

6. The signal encoding apparatus of claim 1, wherein the first symbol has the same period as a Manchester encoding data rate.

7. The signal encoding apparatus of claim 6, wherein the second symbol has a period that is 1.5 times of the Manchester encoding data rate.

8. A radio frequency identification (RFID) reader comprising the signal encoding apparatus of claim 7.

9. The signal encoding apparatus of claim 6, wherein the delay has a period which is 0.5 times of the Manchester encoding data rate.

10. A radio frequency identification (RFID) reader comprising the signal encoding apparatus of claim 9.

11. A radio frequency identification (RFID) reader comprising the signal encoding apparatus of claim 6.

12. A radio frequency identification (RFID) reader comprising the signal encoding apparatus of claim 1.

13. A signal encoding method using a signal encoding apparatus, the signal encoding method comprising:
    transmitting a first symbol if data received after an initial state is zero (0), and then returning to the initial state, and delaying for a given time period if the data received after the initial state is one (1); and
    transmitting the second symbol if data received after the delayed given time period is zero (0), and then returning to the initial state, and transmitting the first symbol if the data received after the delayed given time period is one (1), and then standing by.

14. The signal encoding method of claim 13, further comprising transmitting the second symbol if data received while standing by after transmitting the first symbol is zero (0), and returning to the initial state.

15. The signal encoding method of claim 13, further comprising transmitting the first symbol if data received while standing by after transmitting the first symbol is one (1), and standing-by.

16. The signal encoding method of claim 13, wherein the first symbol has the same period as a Manchester encoding data rate.

17. The signal encoding method of claim 16, wherein the second symbol has a period that is 1.5 times of the Manchester encoding data rate.

18. The signal encoding method of claim 16, wherein the delay has a period which is 0.5 times of the Manchester encoding data rate.

* * * * *